United States Patent [19]

Meyer

[11] Patent Number: 5,650,723

[45] Date of Patent: Jul. 22, 1997

[54] FULL ECHO SPIRAL-IN/SPIRAL-OUT MAGNETIC RESONANCE IMAGING

[75] Inventor: Craig H. Meyer, Palo Alto, Calif.

[73] Assignee: The Board of Trustees of the Leland Stanford Junior University, Palo Alto, Calif.

[21] Appl. No.: 643,650

[22] Filed: May 6, 1996

Related U.S. Application Data

[63] Continuation of Ser. No. 511,174, Aug. 4, 1995, Pat. No. 5,539,313.

[51] Int. Cl.[6] .................................................. G01V 3/00
[52] U.S. Cl. .............................................. 324/309; 324/307
[58] Field of Search ..................................... 324/300, 307, 324/309, 310, 311, 312, 313, 314, 318, 322; 128/653.2, 653.3

[56] References Cited

U.S. PATENT DOCUMENTS

| | | | |
|---|---|---|---|
| 5,258,711 | 11/1993 | Hardy | 324/309 |
| 5,270,653 | 12/1993 | Pauly | 324/309 |
| 5,539,313 | 7/1996 | Meyer | 324/309 |

*Primary Examiner*—Louis M. Arana
*Attorney, Agent, or Firm*—Townsend and Townsend Crew LLP; Henry K. Woodward

[57] ABSTRACT

$T_2$-weighted interleaved spiral scanning is employed for imaging abdominal tumors. The gradients scan k-space in a spiral-in and spiral-out sequence with a first spiral starting at the edge of k-space and reaching the origin at signal echo time and then spiraling out to the edge of k-space preferably as a k-space conjugate of the inward spiral. A set of interleaves rotated through 180° contains sufficient data to reconstruct an image. Rotating through a full 360° provides additional insensitivity to $T_2$ decay, inhomogeneity, and flow.

24 Claims, 9 Drawing Sheets

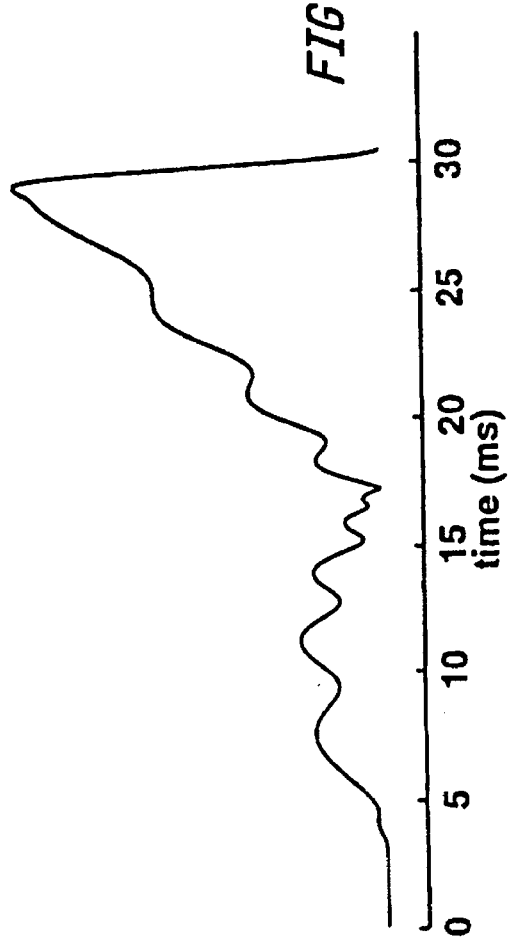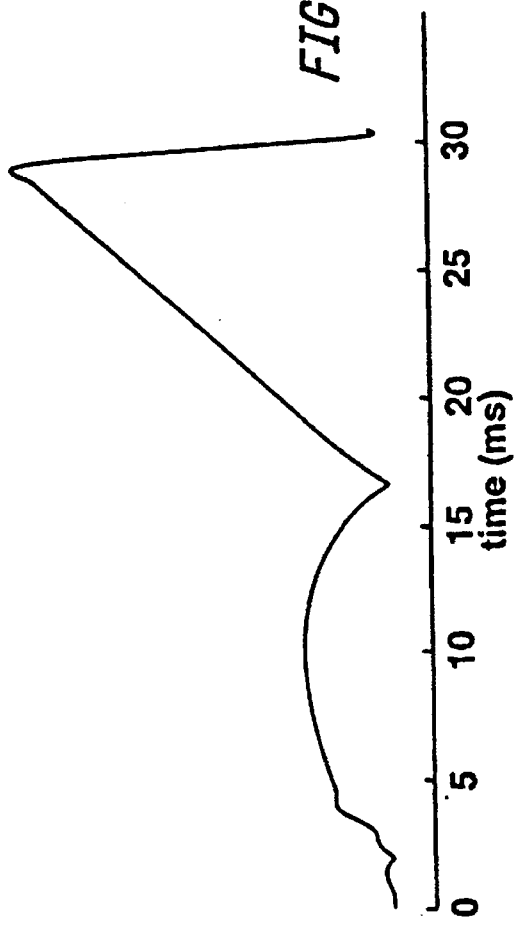

FULL ECHO SPIRAL-IN/SPIRAL-OUT MAGNETIC RESONANCE IMAGING

This is a continuation of U.S. application Ser. No. 08/511,174 filed Aug. 4, 1995, now U.S. Pat. No. 5,539,313.

This invention was made with U.S. Government support under grant No. IROICA 50948 awarded to Stanford University by the National Institute of Health. The Government has certain rights in this invention.

BACKGROUND OF THE INVENTION

This invention relates generally to magnetic resonance imaging (MRI) and, more particularly, the invention relates to fast spiral $T_2$-weighted imaging.

Magnetic resonance imaging (MRI) is a non-destructive method for the analysis of materials and represents a new approach to medical imaging. It is generally non-invasive and does not involve ionizing radiation. In very general terms, nuclear magnetic moments are excited at specific spin precession frequencies which are proportional to the local magnetic field. The radio-frequency signals resulting from the precession of these spins are received using pickup coils. By manipulating the magnetic fields, an array of signals is provided representing different regions of the volume. These are combined to produce a volumetric image of the nuclear spin density of the body.

$T_2$-weighted abdominal tumor imaging is a difficult problem, mainly because of motion artifacts and limited SNR and resolution. Spiral scanning can reduce abdominal motion artifacts by reducing the scan time, preferably to under a breath-hold, and because of the intrinsic robustness of spiral scanning in presence of motion. Further, spiral scanning produces few objectionable motion artifacts because the center of k space is scanned redundantly, the moments of spirals of well-behaved, and the artifacts are spiral rather than coherent ghosts. Spiral scanning addresses the problem of limited SNR by using long readout periods and the problem of limited resolution by efficiently scanning k space.

The present invention is directed to $T_2$-weighted interleaved spiral scanning which is particularly useful for abdominal tumor imaging.

SUMMARY OF THE INVENTION

Briefly, in accordance with the invention a fast spiral $T_2$-weighted imaging process and apparatus are provided. Conventionally, in free induction decay (FID) imaging a spiral scan in k-space starts at the origin thus collecting low spatial frequencies near the origin. For spin-echo imaging in accordance with the invention, both sides of the echo are scanned by first moving to the edge of k-space, spiraling in so that the origin is reached at the echo time, and then spiraling out from the origin on a path that is the k-space conjugate of the inward spiral. Low-order moments are small near the k-space original, and advantageous flow and motion properties of k-space spirals are preserved.

The invention and objects and features thereof will be more readily apparent from the following description and appended claims when take with the drawings.

BRIEF DESCRIPTION OF THE DRAWINGS

FIGS. 11A, 11B illustrate first moments of the gradients of FIGS. 9, 10.

DESCRIPTION OF THE PREFERRED EMBODIMENT

Figure 1A:
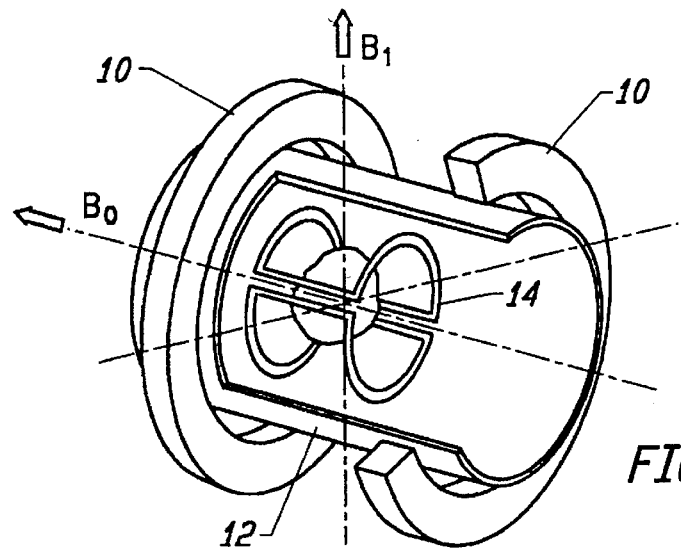
FIGS. 1A–1D illustrate the arrangement of conventional MRI apparatus and magnetic fields generated therein.
Figure 1B:
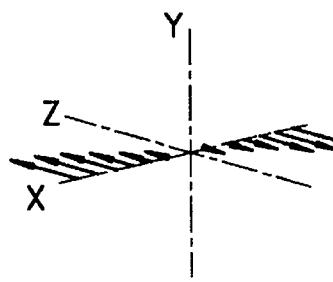
Figure 1C:
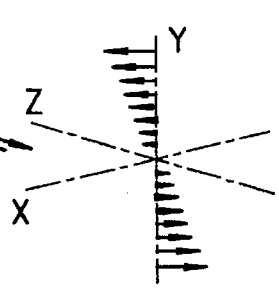
Figure 1D:
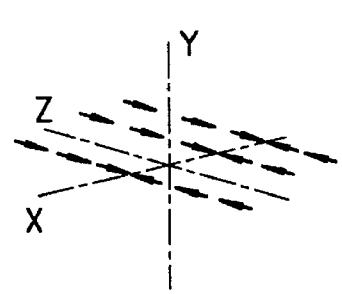

Referring now to the drawings, FIG. 1A is a perspective view partially in section illustrating coil apparatus in an NMR imaging system, and FIGS. 1B–1D illustrate field gradients which can be produced in the apparatus of FIG. 1A. This apparatus is discussed by Hinshaw and Lent, "An Introduction to NMR Imaging: From the Bloch Equation to the Imaging Equation," *Proceedings of the IEEE*, Vol. 71, No. 3, March 1983, pp. 338–350. Briefly, the uniform static field $B_0$ is generated by the magnet comprising the coil pair 10. A gradient field $G_x$ is generated by a complex gradient coil set which can be wound on the cylinder 12. An RF field $B_1$ is generated by a saddle coil 14. A patient undergoing imaging would be positioned along the Z axis within the saddle coil 14.

In FIG. 1B an X gradient field is shown which is parallel to the static field $B_0$ and varies linearly with distance along the X axis but does not vary with distance along the Y and Z axes. FIGS. 1C and 1D are similar representations of the Y gradient and Z gradient fields, respectively.

Figure 2:
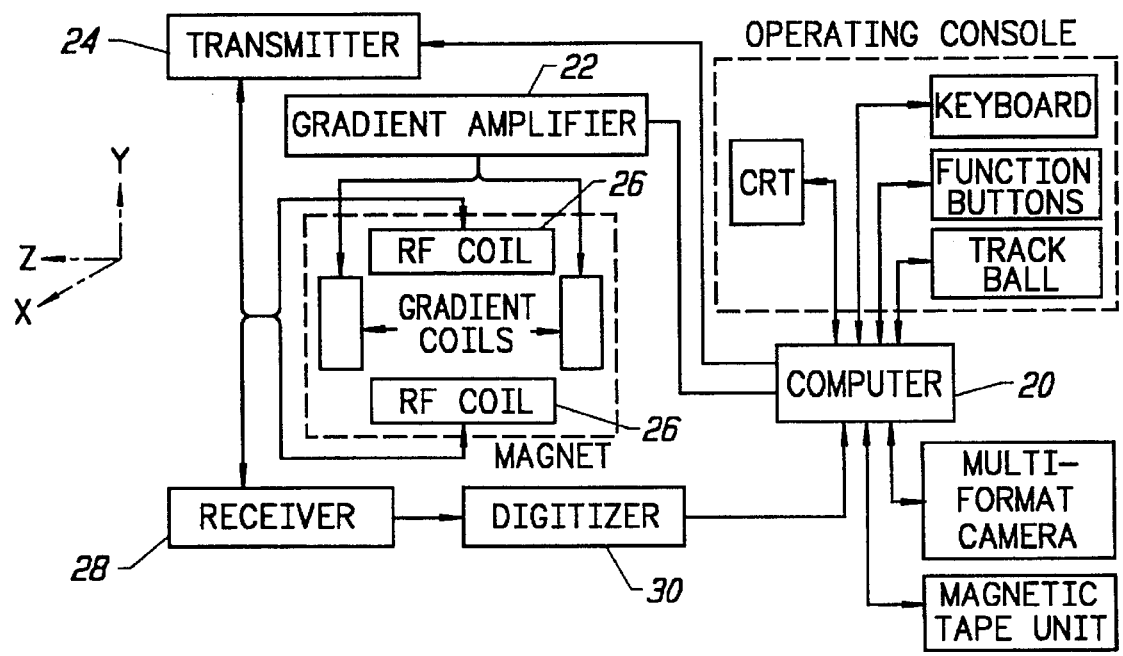
FIG. 2 is a functional block diagram of MRI imaging.

FIG. 2 is a functional block diagram of the imaging apparatus as disclosed in *NMR—A Perspective on Imaging*, General Electric Company. A computer 20 is programmed to control the operation of the NMR apparatus and process free induction decay (FID) signals detected therefrom. The gradient field is energized by a gradient amplifier 22, and the RF coils for impressing an RF magnetic moment at the Larmor frequency is controlled by the transmitter 24 and the RF coils 26. After the selected nuclei have been flipped, the RF coils 26 are employed to detect the FID signal which is passed to the receiver 28 and thence through digitizer 30 for processing by computer 20.

Figure 4:
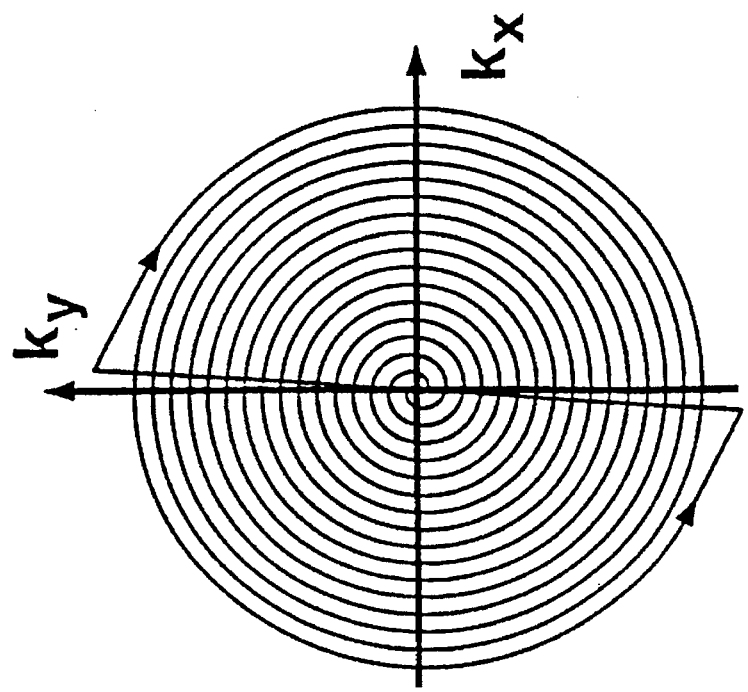
FIG. 4 illustrates a k-space spiral trajectory resulting from the pulse sequence of FIG. 3.
Figure 3:
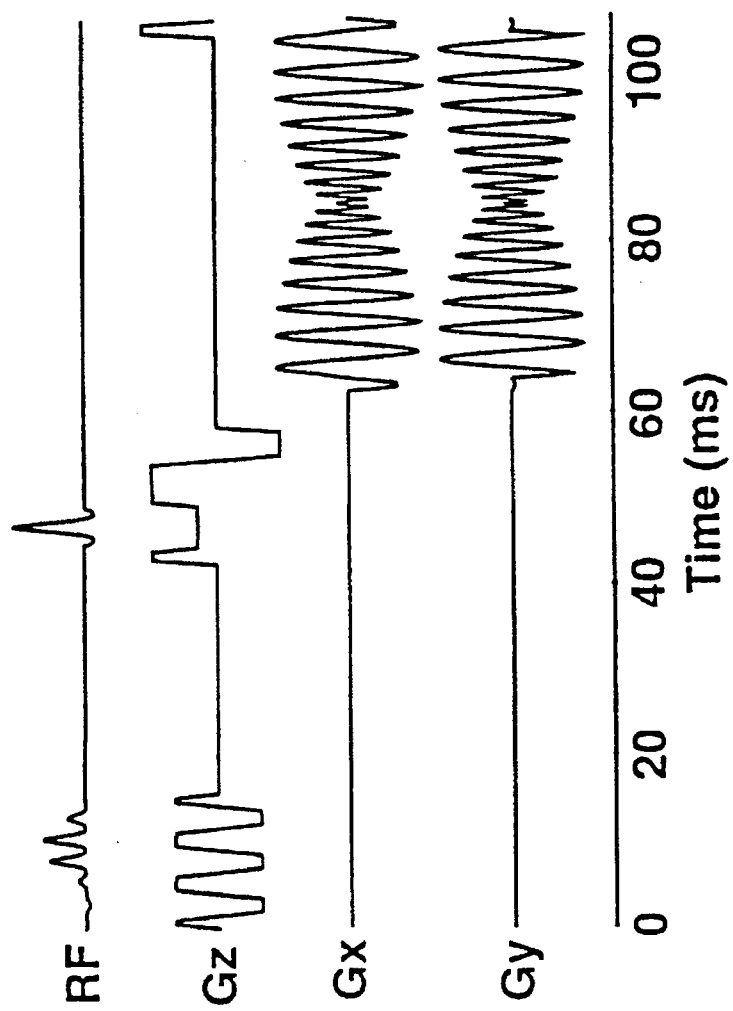
FIG. 3 illustrates RF excitation pulses and magnetic gradients in accordance with one embodiment of the invention.

As noted above, in conventional FID imaging a spiral scan in k-space starts at the origin thus collecting low spatial frequencies near the origin. In accordance with the invention, both sides of a spin echo are scanned by first moving to the edge of k space, spiraling in so that we reach the origin at the echo time, and then spiraling out on a path that is the k-space conjugate of the inward spiral. The low-order moments are small near the k-space origin and most of the advantageous flow and motion properties of spirals are preserved. FIG. 3 shows a spiral-in/spiral-out pulse sequence, and the corresponding k-space trajectory for one interleaf is shown in FIG. 4. The spectral-spatial excitation pulse (see U.S. Pat. Nos. 4,999,580 and No. 5,233, 301) suppresses fat while exciting a particular slice, which permits water-selective multislice imaging. The slice-select gradients of the optimal 180° pulse are flow-compensated.

Figure 5A:
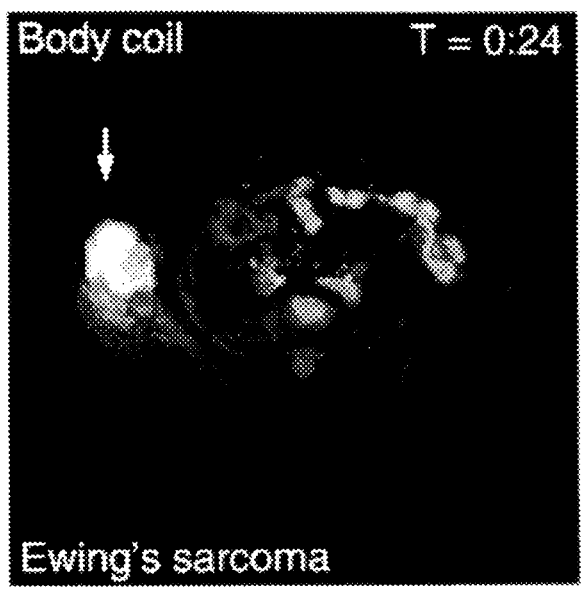
FIGS. 5A, 5B illustrate breath-held full-echo images using the method in accordance with the invention.
Figure 5B:
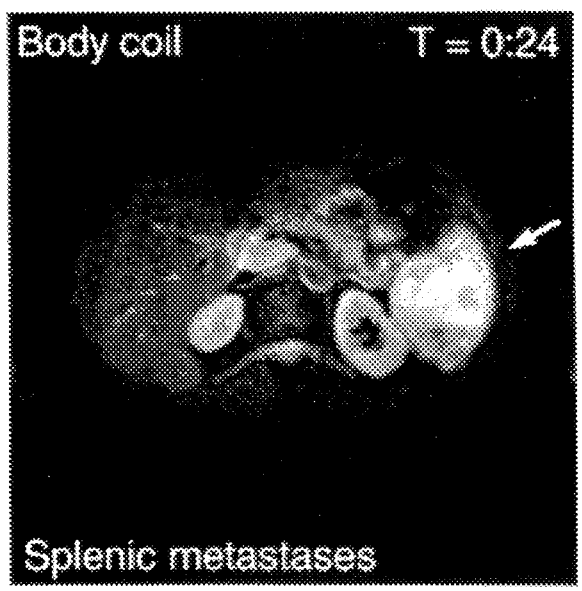

The most robust way to use this sequence is to collect interleaves over a full 360°. Each part of k space is thus scanned twice, once while spiraling in and once while spiraling out. The redundant data reduces $T_2$ blurring. For faster scanning, one can eliminate the redundant scanning and just collect half of the interleaves. Either good $B_0$ homogeneity or good compensation for inhomogeneity are important for high-quality image reconstruction, especially for non-redundant scanning. The pulse sequence in FIG. 3 uses 50-ms readouts to produce 196×196 resolution over a 36-cm FOV on a standard GE Signa scanner as illustrated in FIGS. 5A, 5B. FIG. 5A is an image of a patient with Ewing's sarcoma with a full-echo sequence in accordance with the invention yielding reasonable resolution (196×196 pixels) and SNR in a breath-hold. FIG. 5B is a similar image of a patient with splenic metastases. We use 6 interleaves for a non-redundant scan and 12 interleaves for a redundant scan. An entire $T_2$-weighted multislice set is acquired in a reasonable breath-hold of 12–24 s.

Figure 6A:
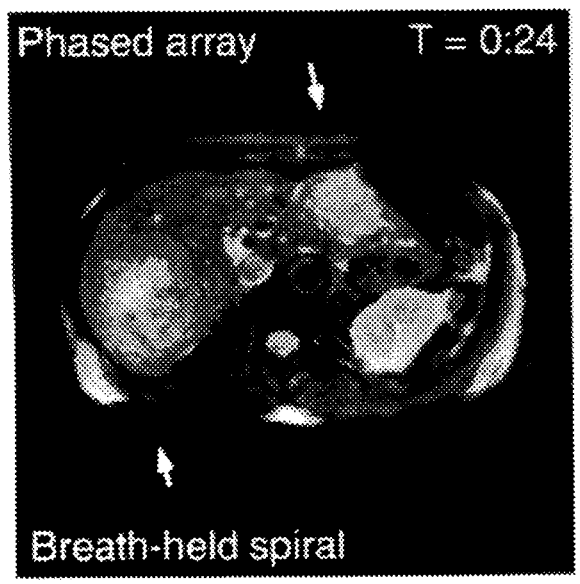
FIGS. 6A, 6B illustrate a breath-held full echo versus 2DFT images for a patient with liver metastases.
Figure 6B:
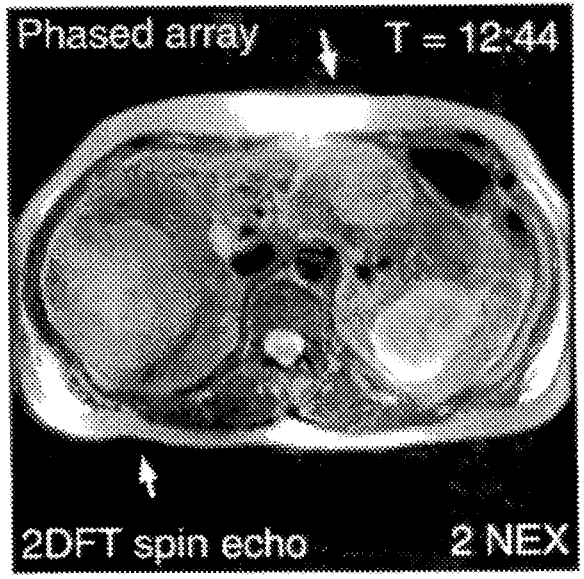

With body-coil reception, the SNR of breath-held abdominal image is usually acceptable for a 12-interleaf scan. However, the SNR is improved with phased-array signal reception as illustrated in FIGS. 6A, 6B. FIG. 6A illustrates liver metastases taken in a breath-held full-echo in accordance with the invention, while FIG. 6B illustrates the same slice using a 2DFT scan. The spiral scan was 30 times shorter than the 2DFT scan thus reducing motion blurring. Even with phased-array reception, it is better to use the 12-interleaf redundant scan when the patient is able to tolerate the longer breath-hold. Shorter breath-holds will become feasible as faster gradients and optimized abdominal phased-array coils become available in the near future.

Image reconstruction for the spiral-in/spiral-out technique is performed using the known technique of gridding, as discussed by Meyer et al. in "Fast Spiral Coronary Artery Imaging," Magnetic Resonance in Medicine, 28(2):202–213, Dec. 1992. Field maps are produced using data from two single-shot readouts acquired at different echo times at the start of the scan. These field maps are used to correct for blurring due to magnetic field inhomogeneity. One technique for doing this correction was described by Noll et al. in "A Homogeneity Correction Method for Magnetic Resonance Imaging with Time-Varying Gradients," IEEE Transactions on Medical Imaging, 10(4):629–637, 1991.

As mentioned above, collecting interleaves over a full 360 degrees is the most robust way to use a spiral-in/spiral-out sequence, because all parts of k space are treated equally. Each point in k space is covered twice and the resulting signals are combined. This combination can be done before the image reconstruction, but it is preferable to grid the spiral-in and spiral-out portions independently so that inhomogeneity correction algorithms work properly. The signals from the spiral-in and spiral-out portions are effectively added together in the gridding reconstruction after inhomogeneity correction.

The effect of this signal addition is to average out differences between the spiral-in and spiral-out scans. The main differences between the scans relate to their differing sensitivity to $T_2$ decay, inhomogeneity, and flow. $T_2$ decay during the spiral-in portion leads to enhanced signal at the periphery of k space as compared to the center of k space. The spiral-out portion has the opposite $T_2$ behavior, so that the combination of the two leads to a much flatter $T_2$ response. The signal averaging also smooths out the inhomogeneity and flow responses in different but analogous ways.

Figure 7A:
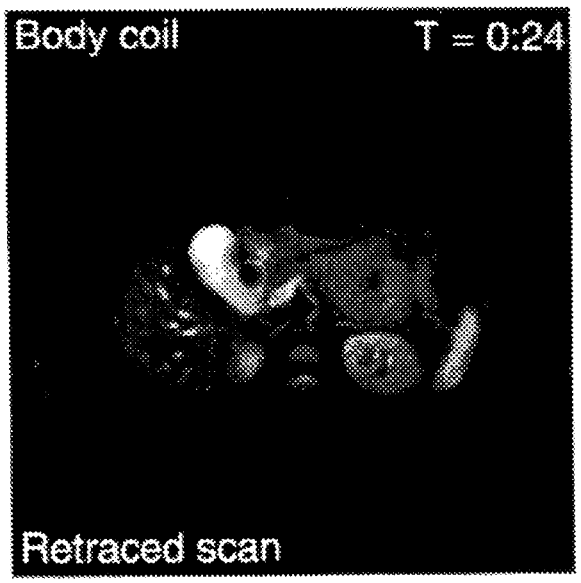
FIGS. 7A, 7B illustrate decreases in signal to noise ratio.
Figure 7B:
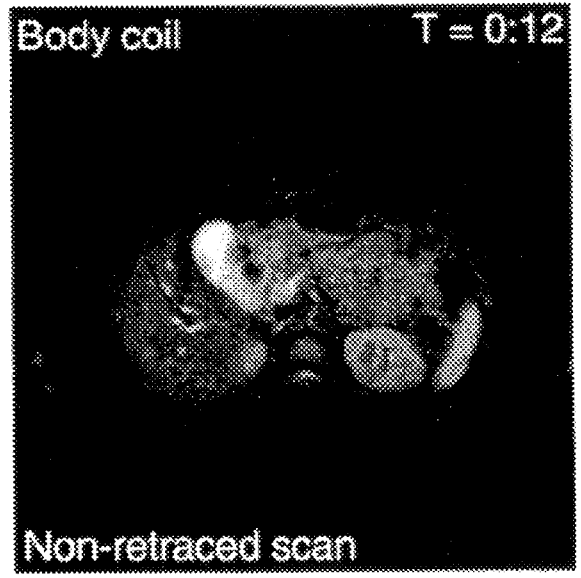

The penalty for collecting interleaves over a full 360 degrees is an increase in scan time. However, all of k space has been sampled after collecting interleaves over just 180 degrees. In this case, half of k space is sampled on the spiral-in portion of interleaves and the other half is sampled on the spiral-out portions. FIG. 7A shows an image reconstructed with a full 360 degrees of data and FIG. 7B shows an image reconstructed with just 180 degrees of the same data. The effective acquisition time of FIG. 7B is half that of FIG. 7A. FIG. 7B shows the expected square root of two decrease in signal-to-noise ratio because of the decreased scan time, but otherwise the images are comparable.

Figure 8:
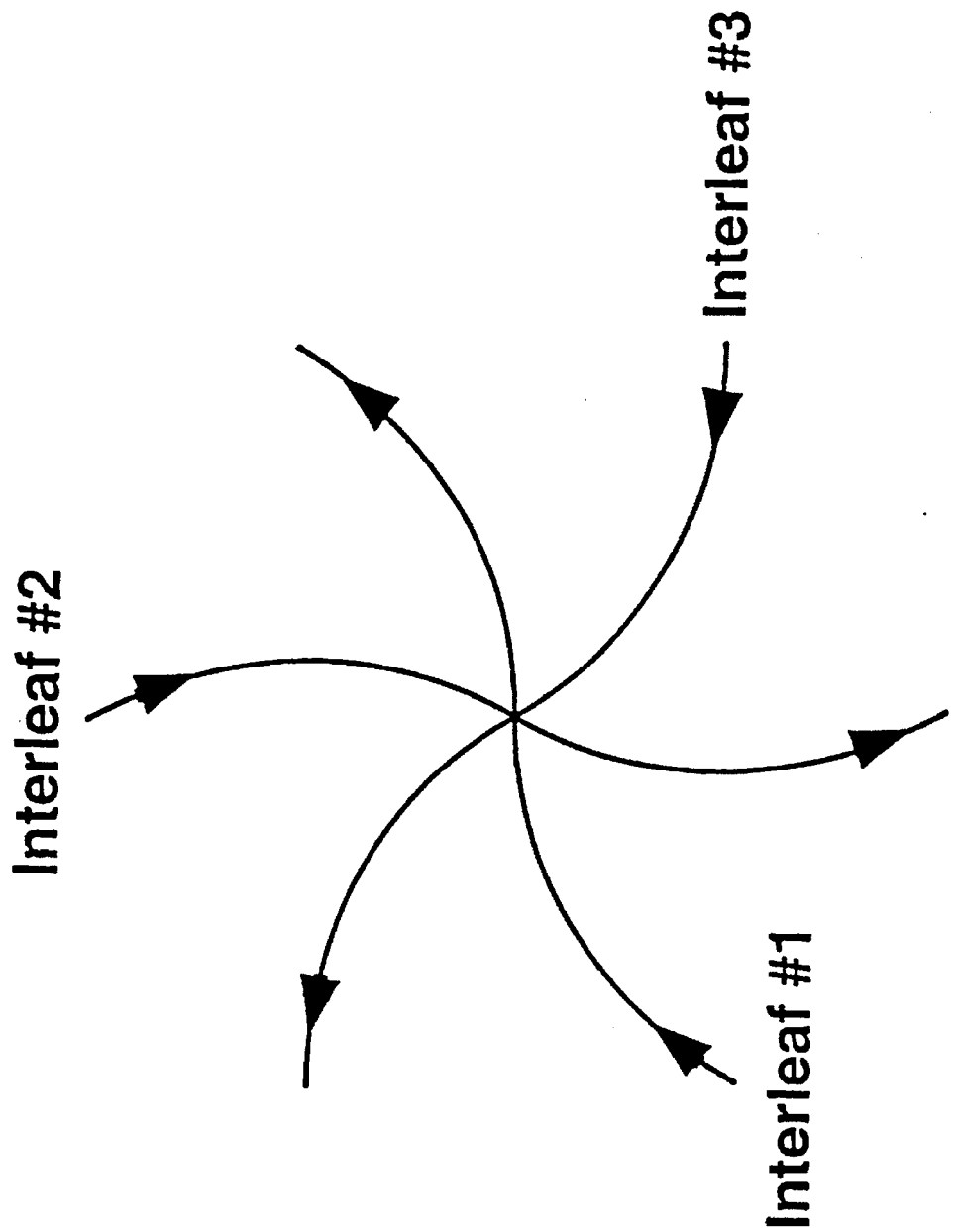
FIG. 8 illustrates k-space scans.

When rotating through just 180 degrees, artifacts can result from $T_2$ decay, inhomogeneity and flow, because the different scans of k space have differing sensitivities. These artifacts are less objectionable with some rotation schemes than with others. In particular, it is usually best to place each spiral-in segment between two spiral-out segments. In this case, artifacts from $T_2$ decay, inhomogeneity and flow are deposited toward the periphery of the image, which is often of less interest clinically. One way of implementing such a 180-degree non-redundant scan is shown in FIG. 8, which depicts a three-interleaf non-redundant scan of k space. Interleaf #1 is collected with the gradients at a zero-degree rotation. In a redundant 360-degree scan, interleaf #2 would be collected with the gradients rotated 60 degrees. In this non-redundant case, the gradients for interleaf #2 are rotated 240 degrees, which is the sum of 60 degrees and 180 degrees. Interleaf #3 is collected with 120 degrees of gradient rotation, as would be the case in a redundant scan. With this method, all of k space is covered in 3 interleaves, and the spiral-in and spiral-out portions alternate as desired.

This technique can of course be extended to more interleaves. It is most easily implemented with an odd number of interleaves, because then the rotation angle increments are the following simple "bit-reversed" pattern: 0, (180 degrees +delta), 2*delta, (180 degrees+3*delta), etc. However, this basic technique can also be adapted to an even number of interleaves.

A useful variation of the technique illustrated in FIG. 8 is to design the sequence so that it covers twice the desired field-of-view radius. In this case, the artifacts from non-redundant scanning appear outside the desired FOV. Such a sequence would require the same scan time as a 360-degree redundant scan. The advantage of such a technique over a redundant scan is that it would suppress spatial aliasing of structures outside the desired FOV.

The gradient design for spiral-in/spiral-out scanning is based on principles similar to that used for conventional spiral-out scanning, as described previously by Meyer et al., supra. The spiral k-space trajectory is defined, and then the gradients are optimally designed to scan the trajectory as rapidly as possible subject to gradient amplifier system constraints. This optimization can either be based on a slew-rate and amplitude model or on a more-advanced circuit model. For the often-desired case of spiraling in on one path and spiraling out on a path that is a k space conjugate, one can simply design a spiral-out gradient and then use a time-reversed version of this gradient for the spiral-in portion. Additionally, one must first get to the edge of k space. This is performed using a transition gradient. This transition gradient is designed to get to the desired edge of k space to start the spiral-in scan. It must be designed so that when the scan reaches the desired point in k space the gradient amplitudes are matched to the gradient amplitudes of the beginning of the spiral-in gradients. Data is typically not collected during the transition gradients.

Figure 9:
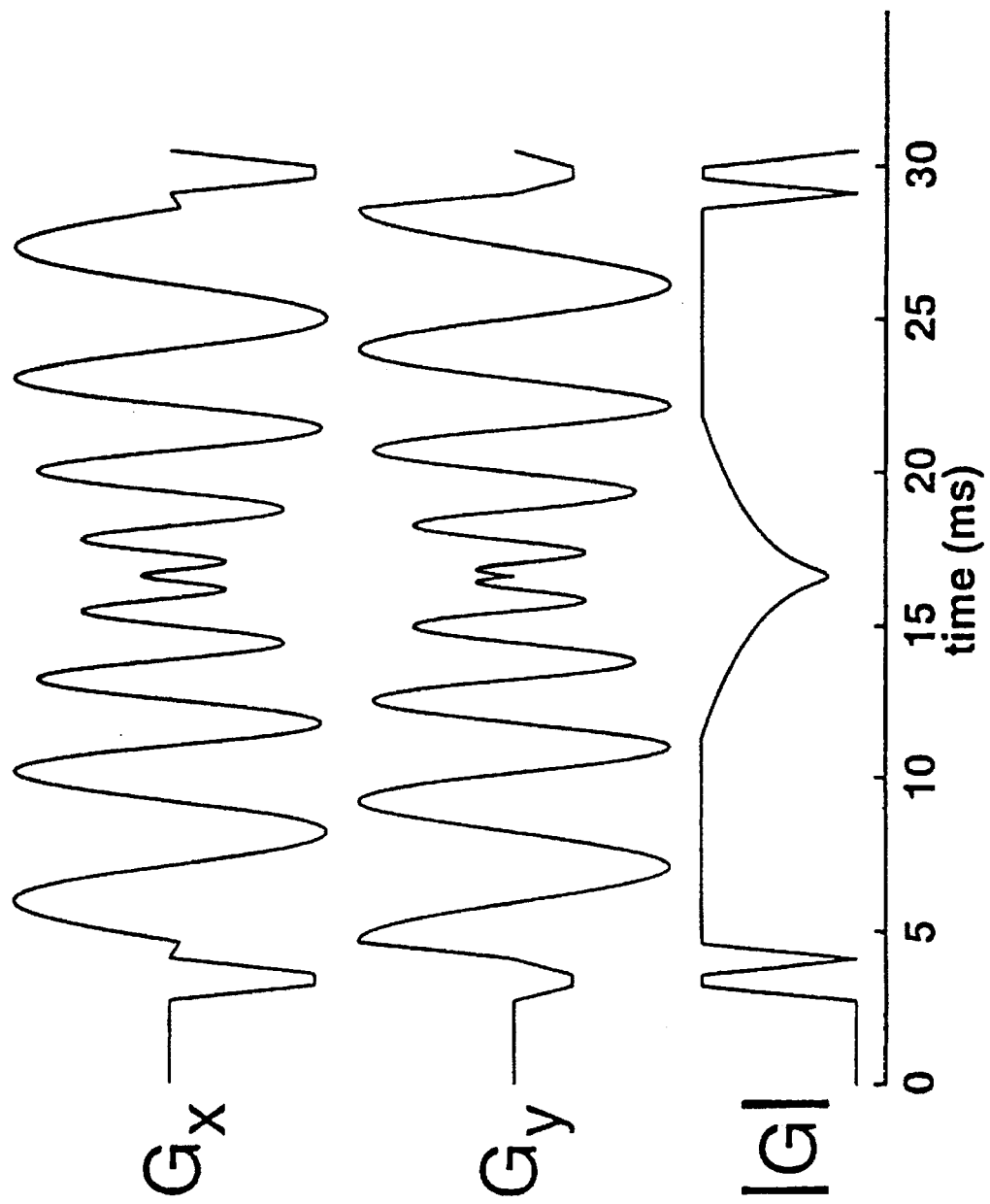
FIG. 9 illustrates gradients for k-space scans.

One unique element of the design of spiral-in/spiral-out gradients is that the gradient amplitude does not need to be zero at the center of k space. Some time savings can be achieved by maintaining a non-zero gradient amplitude, although gradient amplifier performance limits still require a reduction of gradient amplitude near the k-space origin. Spiral-in/spiral-out gradients that exploit this idea are shown in FIG. 9.

As mentioned above, spiral scans have good flow properties. This inherent property of spiral scans was discussed in detail by Nishimura et al. in "A Velocity k-Space Analysis of Flow Effects in Echo-Planar and Spiral Imaging," Magnetic Resonance in Medicine, 33(4):549–556, 1995. Spiral-in/spiral-out scans maintain most of this advantage, so that flowing material such as blood can be imaged with minimal artifacts. The pulse sequence of FIG. 3 exploits this property by using a flow-compensated 180 degree pulse, and thus images blood as bright. Some physicians prefer a bright-blood display that can be attained using such a method. If the physicians prefer a dark blood display, the flow can be suppressed by standard techniques such as spatial presaturation.

Figure 10:
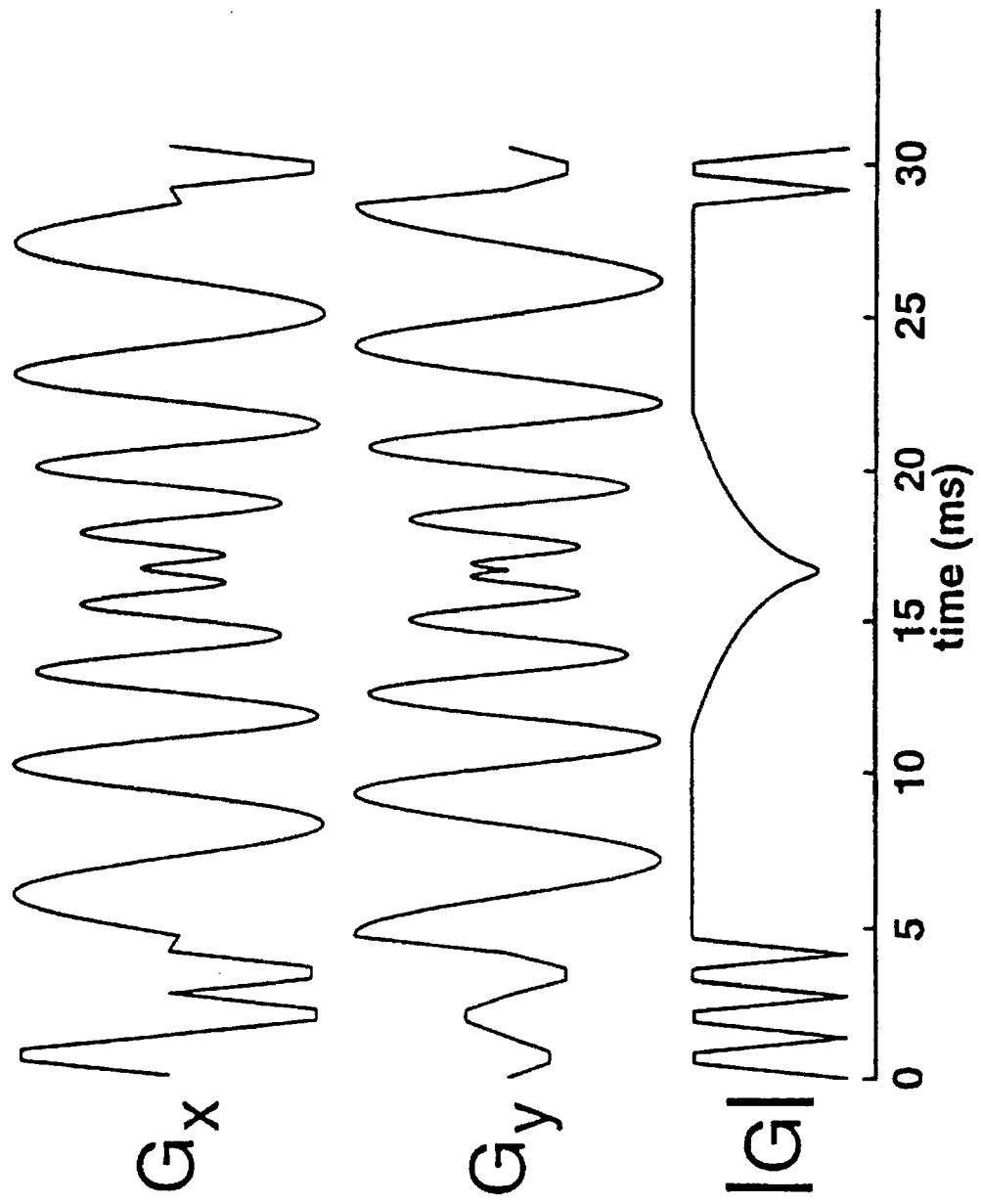
FIG. 10 illustrates gradients after flow compensation.

While spiral-in/spiral-out scans have good flow properties inherently, there are some gradient moments introduced by the transition gradients that degrade the flow performance somewhat. These can be reduced by essentially flow compensating the transition gradients. FIG. 9 shows gradients that have not been flow-compensated and FIG. 10 shows the same gradients after flow-compensation. FIG. 11A shows the magnitude of the first moments of the gradients of FIG. 9 and FIG. 11B shows the first moments of the gradients of FIG. 10. The velocity sensitivity of a gradient waveform is proportional to its first moment. The moments shown in FIG. 11B are preferable to those in FIG. 11A, both because the first moment at the k space origin is smaller (zero) in 11B and because of the smooth nature of the moment amplitude variation in FIG. 11B. The smooth amplitude variation means that the x-axis and y-axis gradient moments are properly in quadrature.

While much of the discussion above centers on $T_2$-weighted spin-echo imaging, it is also possible to use spiral-in/spiral-out gradients for gradient-echo imaging. All of the considerations discussed above apply in this case as well, except those discussions of the 180-degree refocusing pulse, which is not present in a gradient-echo scan. One possible application of spiral-in/spiral-out scanning is functional MRI. A spiral-out scanning technique for functional MRI was described previously by Noll et al. in "Spiral k-space MR Imaging of Cortical Activation," Journal of Magnetic Resonance Imaging, 5(2):49–56, Feb. 1995. In this work, a long gradient-echo time was used, so that there is plenty of time for a spiral-in segment before the spiral-out segment. Functional studies are typically limited by low SNR; adding the additional spiral-in segment would help this problem by increasing the SNR by the square root of two. Also, artifacts due to $T_2$ decay could be reduced, assuming a redundant scan was used.

The invention has proved to be particularly advantageous in using $T_2$-weighted interleaved spiral scanning for abdominal tumor imaging. However, while the invention has been described with reference to a specific embodiment and application, the description is illustrative of the invention and is not to be construed as limiting the invention. Various modifications and applications may occur to those skilled in the art without departing from the true spirit and scope of the invention as defined by the appended claims.

What is claimed is:

1. A method of magnetic resonance imaging comprising the steps of
   a) positioning a body to be imaged in a static magnetic field;
   b) applying RF excitation pulses in the presence of a magnetic gradient for image slice selection;
   c) applying magnetic gradients during signal read-out so that the gradients scan k-space in a spiral-in and spiral-out sequence with a first spiral starting at an edge of k-space and reaching the origin at signal echo time and then a second spiral moves from the origin out to the edge of k-space;
   d) detecting an echo signal; and
   e) repeating steps b), c) and d) whereby one-half of k-space is traversed on spiral-in sequences and another one-half of k-space is traversed on spiral-out sequences.

2. The method as defined by claim 1, wherein each spiral-in spiral is between two spiral-out spirals.

3. A method of magnetic resonance imaging comprising the steps of
   a) positioning a body to be imaged in a static magnetic field;
   b) applying RF excitation pulses in the presence of a magnetic gradient for image slice selection;
   c) applying magnetic gradients during signal read-out so that the gradients scan k-space in a spiral-in and spiral-out sequence with a first spiral starting at an edge of k-space and reaching the origin at signal echo time and then a second spiral moves from the origin out to the edge of k-space;
   d) detecting an echo signal; and
   wherein each spiral-in spiral is between two spiral-out spirals.

4. The method as defined by claim 3, wherein an odd number of interleaved spirals is used, alteration between spiral-in and spiral-out spirals is accomplished in a bit-reversed pattern.

5. The method as defined by claim 4, wherein in step c) magnitudes of said magnetic gradients decrease to a non-zero minimum value in transitioning from spiral-in to spiral-out.

6. The method as defined by claim 3, wherein in step c) magnitudes of said magnetic gradients decrease to a non-zero minimum value in transitioning from spiral-in to spiral-out.

7. The method as defined in claim 3, wherein in step c) said magnetic gradients employ flow compensation to image a moving material.

8. The method as defined in claim 7, wherein step c) includes adding flow compensation gradient lobes to said magnetic gradients.

9. The method as defined in claim 3, wherein step d) detects a spin echo signal.

10. The method as defined in claim 3, wherein step d) detects a gradient echo signal.

11. The method as defined in claim 3, wherein each region of k-space is covered on both a spiral-in sequence and on a spiral-out sequence.

12. Apparatus for magnetic resonance imaging comprising
    a) means for applying a static magnetic field in a body to be imaged;
    b) means for applying RF excitation pulses in the presence of a magnetic gradient for image slice selection;
    c) means for applying magnetic gradients during signal read-out so that the gradients scan k-space in a spiral-in and spiral-out sequence with a first spiral starting at an edge of k-space and reaching the origin at signal echo time and then a second spiral moves from the origin out to the edge of k-space; and d) means for detecting an echo signal;

wherein said means for applying magnetic gradients causes one-half of k-space to be traversed on spiral-in sequences and another one-half of k-space to be traversed on spiral-out sequences.

13. Apparatus as defined in claim 12, wherein each spiral-in spiral is between two spiral-out spirals.

14. Apparatus as defined in claim 13, wherein an odd number of interleaved spirals is used, alteration between spiral-in and spiral-out spirals is accomplished in a bit-reversed pattern.

15. Apparatus as defined in claim 12, wherein magnitudes of said magnetic gradients decrease to a non-zero minimum value in transitioning from spiral-in to spiral-out.

16. Apparatus as defined in claim 12, wherein said magnetic gradients employ flow compensation to image a moving material.

17. Apparatus as defined in claim 16, wherein said magnetic gradients include flow compensation gradient lobes.

18. Apparatus for magnetic resonance imaging comprising a) means for applying a static magnetic field in a body to be imaged;

b) means for applying RF excitation pulses in the presence of a magnetic gradient for image slice selection;

c) means for applying magnetic gradients during signal read-out so that the gradients scan k-space in a spiral-in and spiral-out sequence with a first spiral starting at an edge of k-space and reaching the origin at signal echo time and then a second spiral moves from the origin out to the edge of k-space, said magnetic gradients decreasing to a non-zero minimum value in transitioning from spiral-in to spiral-out; and d) means for detecting an echo signal.

19. Apparatus for magnetic resonance imaging comprising a) means for applying a static magnetic field in a body to be imaged;

b) means for applying RF excitation pulses in the presence of a magnetic gradient for image slice selection;

c) means for applying magnetic gradients during signal read-out so that the gradients scan k-space in a spiral-in and spiral-out sequence with a first spiral starting at an edge of k-space and reaching the origin at signal echo time and then a second spiral moves from the origin out to the edge of k-space, said magnetic gradients employing flow compensation to image a moving material; and d) means for detecting an echo signal.

20. A method of magnetic resonance imaging comprising the steps of a) positioning a body to be imaged in a static magnetic field;

b) applying RF excitation pulses in the presence of a magnetic gradient for image slice selection;

c) applying magnetic gradients during signal read-out so that the gradients scan k-space in a spiral-in and spiral-out sequence with a first spiral starting at an edge of k-space and reaching the origin at signal echo time and then a second spiral moves from the origin out to the edge of k-space; d) detecting an echo signal; and wherein in step c) magnitudes of said magnetic gradients decrease to a non-zero minimum value in transitioning from spiral-in to spiral-out.

21. A method of magnetic resonance imaging comprising the steps of a) positioning a body to be imaged in a static magnetic field;

b) applying RF excitation pulses in the presence of a magnetic gradient for image slice selection;

c) applying magnetic gradients during signal read-out so that the gradients scan k-space in a spiral-in and spiral-out sequence with a first spiral starting at an edge of k-space and reaching the origin at signal echo time and then a second spiral moves from the origin out to the edge of k-space;

d) detecting an echo signal; and wherein in step c) said magnetic gradients employ flow compensation to image a moving material.

22. The method as defined in claim 19, wherein step c) includes adding flow compensation gradient lobes to said magnetic gradients.

23. The method as defined in claim 21, wherein step d) detects a spin echo.

24. The method as defined in claim 21, wherein step d) detects a gradient echo signal.

* * * * *

UNITED STATES PATENT AND TRADEMARK OFFICE
CERTIFICATE OF CORRECTION

| | | |
|---|---|---|
| PATENT NO. | : 5,650,723 | |
| APPLICATION NO. | : 08/643650 | |
| DATED | : July 22, 1997 | |
| INVENTOR(S) | : Meyer | |

It is certified that error appears in the above-identified patent and that said Letters Patent is hereby corrected as shown below:

In the Specification Under Column 1:

· Please replace Column 1, line no. 6-9 with:

-- FEDERALLY-SPONSORED RESEARCH OR DEVELOPMENT
This invention was made with U.S. Government support under contract CA050948 awarded to National Institute of Health. The Government has certain rights in this invention. --

Signed and Sealed this
Twenty-seventh Day of August, 2013

Teresa Stanek Rea
*Acting Director of the United States Patent and Trademark Office*